US008477412B2

(12) United States Patent
Someya et al.

(10) Patent No.: US 8,477,412 B2
(45) Date of Patent: Jul. 2, 2013

(54) COLLECTOR MIRROR EXCHANGING APPARATUS AND METHOD FOR EXTREME ULTRAVIOLET LIGHT SOURCE APPARATUS

(75) Inventors: Hiroshi Someya, Hiratsuka (JP); Tamotsu Abe, Odawara (JP); Takashi Suganuma, Ooiso (JP); Hideo Hoshino, Hiratsuka (JP); Akira Sumitani, Isehara (JP)

(73) Assignee: Gigaphoton Inc., Tochigi (JP)

( * ) Notice: Subject to any disclaimer, the term of this patent is extended or adjusted under 35 U.S.C. 154(b) by 831 days.

(21) Appl. No.: 11/979,513

(22) Filed: Nov. 5, 2007

(65) Prior Publication Data
US 2008/0104828 A1  May 8, 2008

(30) Foreign Application Priority Data

Nov. 7, 2006 (JP) ................................. 2006-301461

(51) Int. Cl.
*G02B 15/14* (2006.01)

(52) U.S. Cl.
USPC ......... 359/354; 359/853; 430/302; 101/450.1

(58) Field of Classification Search
USPC .... 378/34–35; 101/450.1–473; 430/302–305; 359/850–859, 861–866, 872–878, 354–359, 359/726–732; 248/475.1–487
See application file for complete search history.

(56) References Cited

U.S. PATENT DOCUMENTS 5,448,612 A * 9/1995 Kasumi et al. .................. 378/84
6,985,208 B2 * 1/2006 Miyachi et al. ................. 355/53

FOREIGN PATENT DOCUMENTS

| JP | 2004-103961 | 4/2004 |
| JP | 2005-311032 | 11/2005 |
| JP | 2008-108599 | 5/2008 |
| WO | 2004/030423 A1 | 4/2004 |

OTHER PUBLICATIONS

Japanese Office Action with partial English translation issued May 24, 2011 in counterpart Japanese Application No. 2006-301461.

* cited by examiner

*Primary Examiner* — Jennifer L. Doak
(74) *Attorney, Agent, or Firm* — McDermott Will & Emery LLP

(57) ABSTRACT

A collector mirror exchanging apparatus is capable of safely and easily exchanging a collector mirror for collecting extreme ultra violet light emitted from plasma generated within a chamber of an extreme ultra violet light source apparatus. The collector mirror exchanging apparatus includes: a supporting base for supporting a collector mirror or a collector mirror structure; and a guiding rail disposed on the supporting base and regulating a moving direction of the collector mirror or the collector mirror structure; wherein at least the collector mirror is taken out of the chamber by moving the collector mirror or the collector mirror structure along the guiding rail on the supporting base.

2 Claims, 15 Drawing Sheets

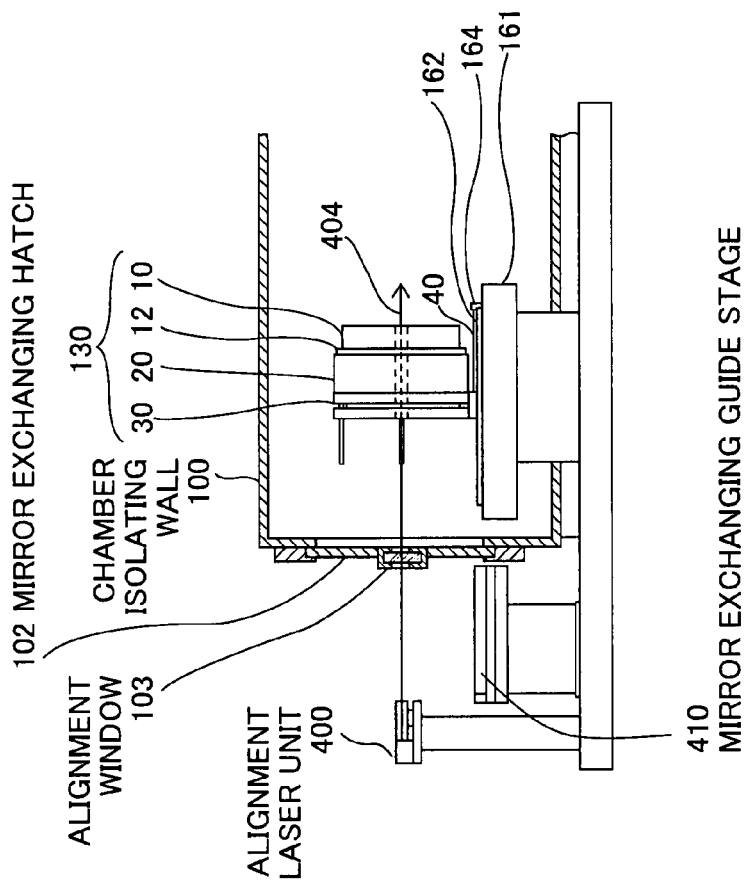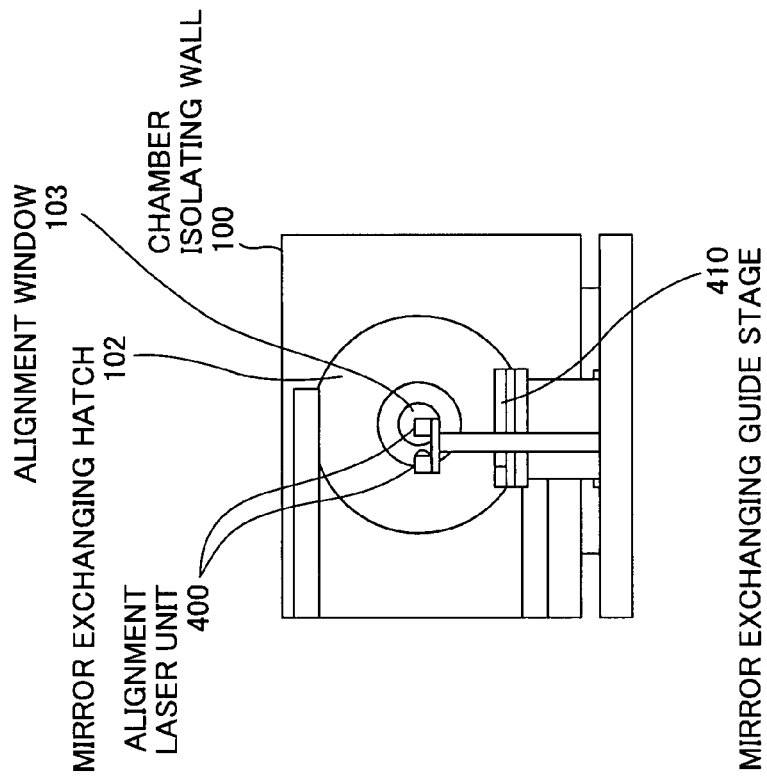

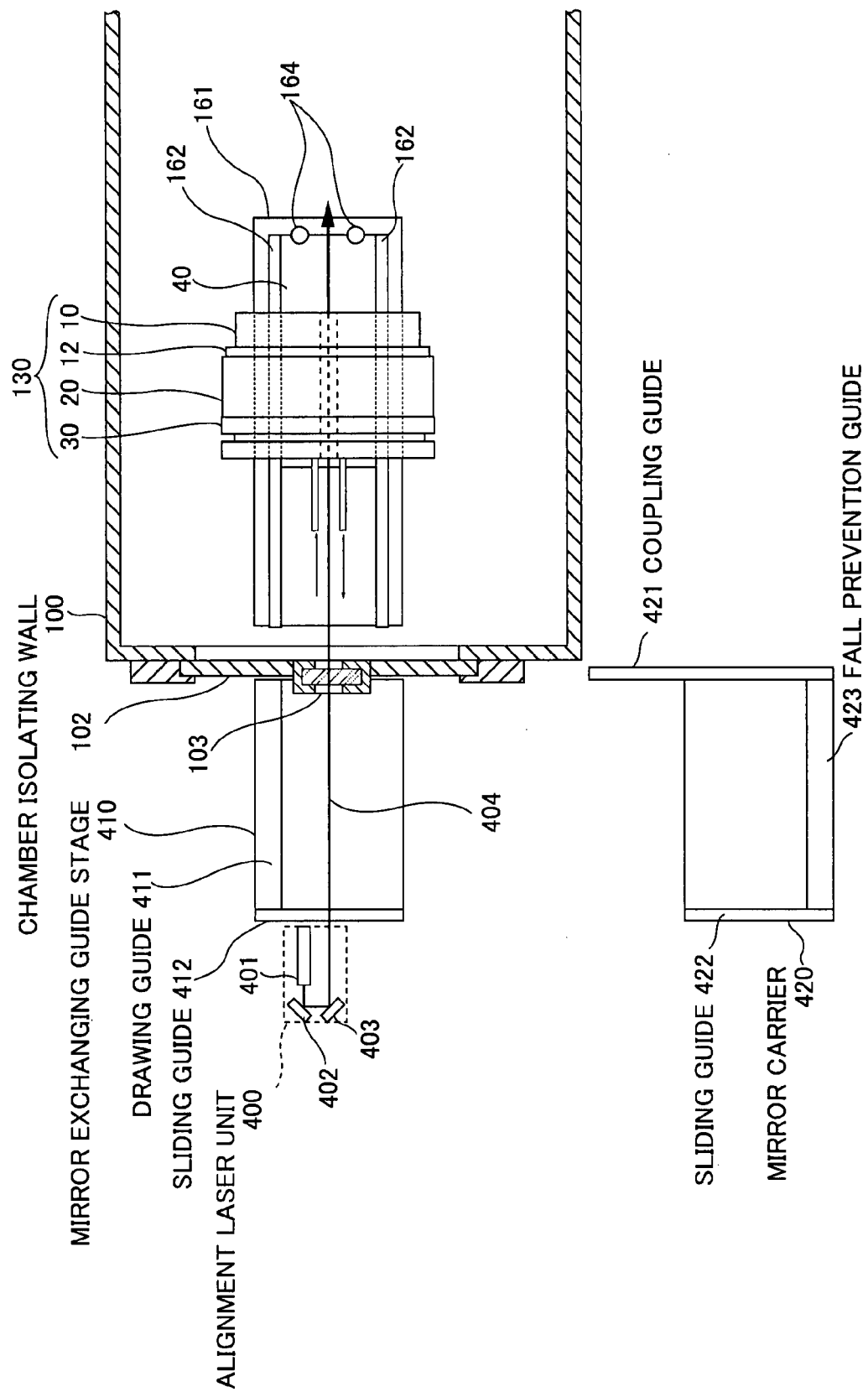

COLLECTOR MIRROR EXCHANGING APPARATUS AND METHOD FOR EXTREME ULTRAVIOLET LIGHT SOURCE APPARATUS

BACKGROUND OF THE INVENTION

1. Field of the Invention

The present invention relates to a collector mirror exchanging apparatus and a collector mirror exchanging method to be used to exchange a collector mirror for collecting extreme ultra violet (EUV) light emitted from plasma in an extreme ultra violet light source apparatus.

2. Description of a Related Art

In recent years, as semiconductor processes become finer, photolithography has been making rapid progress to finer fabrication. In the next generation, microfabrication of 100 nm to 70 nm, or even 50 nm or less will be required. Accordingly, in order to fulfill the requirement for microfabrication of 50 nm or less, for example, exposure equipment is expected to be developed by combining an EUV light source generating EUV light with a wavelength of about 13 nm and reduced projection reflective optics.

As the EUV light source, there are three kinds of light sources, which include an LPP (laser produced plasma) light source using plasma generated by applying a laser beam to a target (hereinafter, also referred to as "LPP type EUV light source apparatus"), a DPP (discharge produced plasma) light source using plasma generated by discharge, and an SR (synchrotron radiation) light source using orbital radiation. Among them, the LPP light source has the advantages that extremely high intensity close to black body radiation can be obtained because plasma density can be made considerably larger, that light emission of only the necessary waveband can be performed by selecting the target material, and that an extremely large collection solid angle of $2\pi$ steradian can be ensured because it is a point light source having substantially isotropic angle distribution and there is no structure surrounding the light source such as electrodes. Therefore, the LPP light source is thought to be predominant as a light source for EUV lithography requiring power of several tens of watts.

For example, EUV light is generated in the LPP type EUV light source apparatus under a principle as follows. That is, a target material is supplied into a vacuum chamber by use of a nozzle, and this target material is irradiated with a laser beam to be excited and turned into plasma. Light with various wavelengths including extreme ultra violet (EUV) light is emitted from plasma thus generated. Then, the EUV light is reflected and collected to be emitted to an exposure unit by use of a collector mirror (light collecting mirror) which selectively reflects light with a desired wavelength (13.5 nm, for example) therein.

As a collector mirror for collecting EUV light with a wave length near 13.5 nm, for example, a mirror is used having a reflecting surface on which thin films of molybdenum (Mo) and silicon (Si) are alternately deposited. Typically, the number of the deposited layers of the Mo/Si thin film ranges up to several hundred. Also, smoothness and a shape of the reflecting surface of the collector mirror should be controlled with an extreme preciseness, in order to increase a collecting efficiency of the EUV light. Therefore, the collector mirror is extremely expensive.

Further, the collector mirror is easily damaged by flying particles such as high speed ions and neutrons emitted from a target material turned into plasma. Therefore, the collector mirror is disposed as far as possible from a plasma generating point (light emitting point). Also, a collecting solid angle of the collecting mirror should be made larger for increasing output power of the EUV light, and therefore, the collector mirror becomes inevitably larger in radius and accordingly becomes heavy.

Exchanging of such a collector mirror is performed manually. However, it is considerably troublesome to exchange a heavy collector mirror and, if the operation failed, the failure probably would lead to a breakage of the collector mirror and an injury to an operator. Since the collector mirror is extremely expensive, resulting damage thereof is considerable. Therefore, a method of exchanging collector mirrors safely and easily is desired.

As a relating technology, Japanese Patent Application Publication JP-P2004-103961A discloses a mirror holding unit including a mirror and an elastic member for elastically coupling the mirror to a hatch which is openably provided on a wall of a chamber capable of generating reduced-pressure environment, in order to make it easy to exchange an illuminating optical system and keep an initial alignment accuracy, and further make short a time required for the exchange to improve exposure throughput.

In JP-P2004-103961A, however, weights of the collector mirror, the hatch of the chamber to which the mirror is attached, and the supporting member (elastic member) for coupling the mirror to the hatch are not taken into consideration. That is, although a heavy weight should be supported when fixing these parts to the wall of the chamber, no means for supporting the heavy weight is disclosed.

SUMMARY OF THE INVENTION

The present invention has been achieved in view of these problems. An object of the present invention is to provide an apparatus and a method of safely and easily exchanging a collector mirror for collecting EUV light in an EUV light source apparatus.

For achieving the object, a collector mirror exchanging apparatus according to one aspect of the present invention is an apparatus to be used for exchanging a collector mirror, which reflects and collects extreme ultra violet light emitted from plasma generated in a chamber of an extreme ultra violet light source apparatus, and includes: a supporting base which supports a collector mirror or a collector mirror structure including the collector mirror; and guiding means disposed on the supporting base and regulating a moving direction of the collector mirror or the collector mirror structure; wherein at least the collector mirror is taken out of the chamber by moving the collector mirror or the collector mirror structure along the guiding means on the supporting base.

Also, a collector mirror exchanging method according to one aspect of the present invention is a method of exchanging a collector mirror, which reflects and collects extreme ultra violet light emitted from plasma generated in a chamber of an extreme ultra violet light source apparatus, and includes the steps of: (a) moving a collector mirror or a collector mirror structure including the collector mirror while regulating a moving direction thereof along guiding means disposed on a supporting base, to take at least the collector mirror out of the chamber; (b) exchanging a used collector mirror for a new collector mirror outside the chamber; and (c) moving the collector mirror after exchange or the collector mirror structure including the mirror after exchange while regulating a moving direction thereof along the guiding means disposed on the supporting base, to return at least the collector mirror to a former position thereof.

According to the present invention, a collector mirror or a collector mirror structure integrating the collector mirror and a mechanism therearound is moved on a supporting base while a moving direction thereof is being regulated, and thereby, the collector mirror is exchanged after having been taken out of a chamber. Therefore, a collector mirror can be exchanged safely and with a high accuracy in a short time, even if the collector mirror or the structure has a heavyweight. As a result, trouble in exchanging the collector mirror can be reduced and an accident of breaking a collector mirror or an injury thereby is prevented from occurring, and a line operating rate can be improved.

BRIEF DESCRIPTION OF THE DRAWINGS

FIGS. 8A and 8B are diagrams showing parts of an extreme ultra violet light source apparatus including a collector mirror exchanging apparatus according to a fourth embodiment of the present invention;

FIG. 9 is a plan view showing a part of the extreme ultra violet light source apparatus including the collector mirror exchanging apparatus according to the fourth embodiment of the present invention;

DESCRIPTION OF THE PREFERRED EMBODIMENTS

Figure 1:
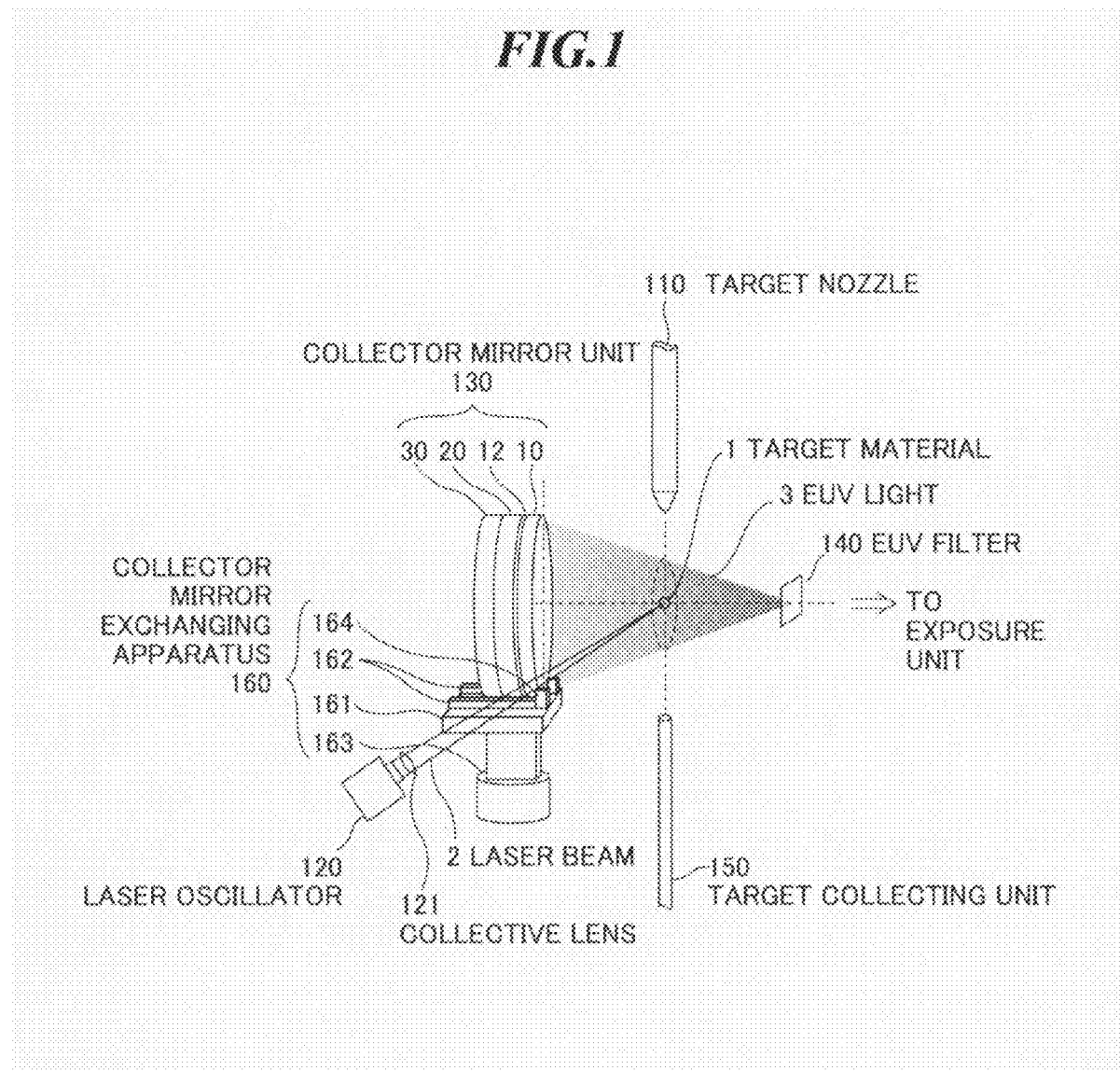
FIG. 1 is a perspective diagram showing a part of an extreme ultra violet light source apparatus including a collector mirror exchanging apparatus according to a first embodiment of the present invention.

Hereinafter, embodiments of the present invention will be described in detail with reference to the drawings. The same constituent element will be denoted by the same reference numeral and redundant description thereof will be omitted.

FIG. 1 is a perspective view showing a part of an extreme ultra violet (EUV) light source apparatus including a collector mirror exchanging apparatus according to a first embodiment of the present invention. This EUV light source apparatus includes a target nozzle 110, a laser oscillator 120, a collector mirror unit 130, an EUV filter 140, a target collecting unit 150, and a collector mirror exchanging apparatus 160. These units except for the laser oscillator 120 are disposed within a chamber provided with a vacuum exhausting unit.

The target nozzle 110 ejects a target material 1 supplied from outside the chamber and forms a target jet or a droplet target to be supplied to a plasma generating point (position where plasma is generated by irradiation of the target material 1 with a laser beam 2). In the case of forming the droplet target, there is further provided a vibrating mechanism which vibrates the target nozzle 110 for forming a target jet at a predetermined frequency.

The laser oscillator 120 is a laser light source which can pulse-oscillate at a high repetition frequency, and outputs the laser beam 2 for exciting the target material 1 by irradiation thereof. Also, a collective lens 121 is disposed on a light path of the laser oscillator 120, and thereby, a laser beam 2 output from the laser oscillator 120 is focused onto the plasma generating point. Although a collective lens 121 is used in FIG. 1, a light collecting system may be constituted with another light collecting optical component or a combination of multiple optical components.

Figure 2:
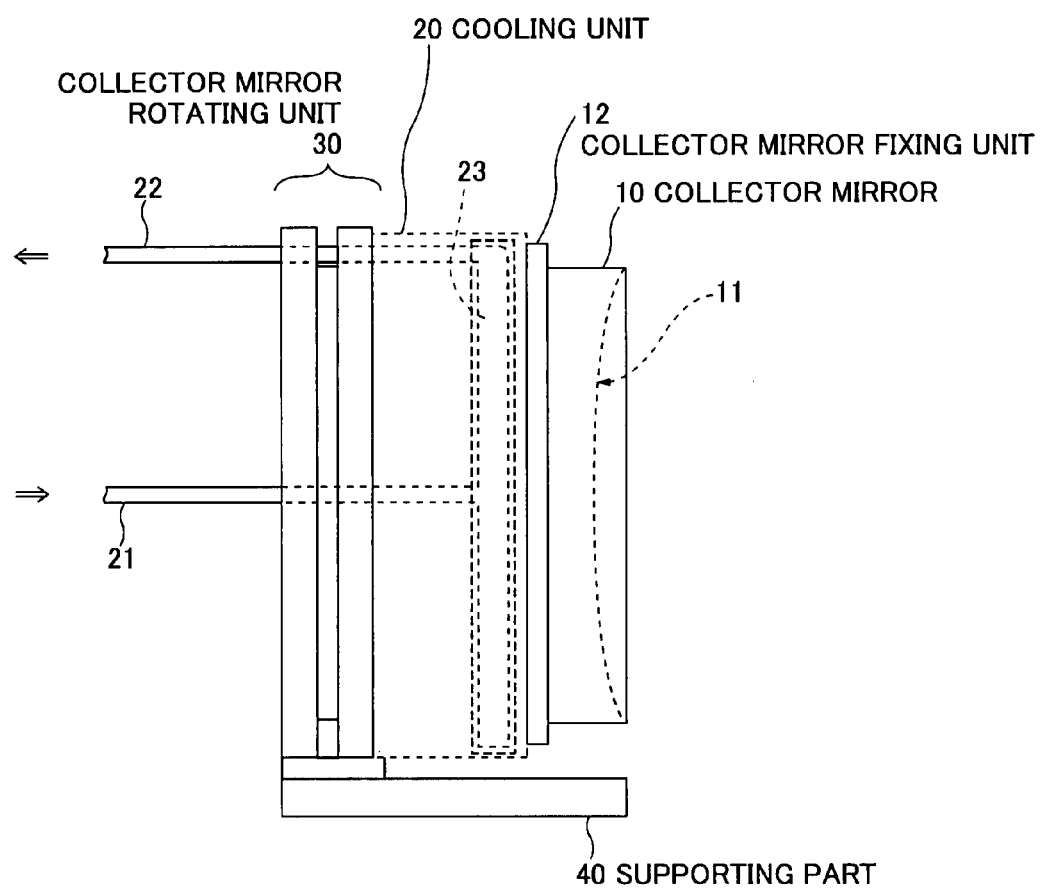
FIG. 2 is an enlarged side view showing a collector mirror unit shown in FIG. 1.

FIG. 2 is an enlarged side view showing the collector mirror unit 130 shown in FIG. 1. The collector mirror unit 130 is a collector mirror structure including a collector mirror 10 which reflects and collects EUV light emitted from plasma, and mechanisms 12 to 40 for maintaining a function of the collector mirror 10. In the present application, either only the collector may be exchanged or the whole collector structure may be exchanged, in exchanging the collector mirror.

The collector mirror unit 130 includes a collector mirror 10, a collector mirror fixing unit 12, a cooling unit 20, a collector mirror rotating unit 30, and a supporting part 40.

The collector mirror 10 has a reflecting surface 11 which selectively reflects EUV light with a predetermined wavelength (13.5 nm, for example) to be focused on a predetermined position. On this reflecting surface 11, there is formed a Mo/Si multi-layered film alternately layered with a molybdenum (Mo) film and a silicon (Si) film, for example. Such a collector mirror 10 is supported by the collector mirror fixing unit 12.

The cooling unit 20 is provided at the rear side of the collector mirror 10 and prevents temperature of the collecting mirror 10 from increasing by heat generated from plasma. In the cooling unit 20, a pipe 21 for introducing coolant like water into the cooling unit 20 and another pipe 22 for discharging the coolant from the cooling unit 20 are provided, and within the cooling unit 20, a flow path 23 is formed for circulating the coolant. The pipes 21 and 22 are formed with a flexible material for accommodating an operation to rotate or exchange the collector mirror 10.

The rotating unit 30 rotates the collector mirror 10 circumferentially, when a part of the reflecting surface of collector mirror 10 is damaged by ions or the like flying from plasma, to reduce an influence of an area damaged in reflectance of EUV light emitted from plasma. The rotating unit 30 employs a worm gear structure including such as a cylindrical worm and a worm wheel. Here, the worm gear structure is a mechanism in which both teeth of a cylindrical worm (screw gear) and a worm wheel (slanted teeth gear) are brought into mesh and the worm wheel is rotated by driving the cylindrical worm to rotate.

Each of these units 10 to 30 is supported by the supporting part 40.

Hereinafter, a direction in which the collector mirror 10 faces a focusing point is referred to as a forward direction of the collector mirror unit 130, and a reverse direction thereof is referred to as a backward direction of the collector mirror unit 130.

Referring to FIG. 1 again, plasma is generated by irradiating the target material 1 ejected from the target nozzle 110 with a laser beam 2, and light with various wavelengths is emitted therefrom. A light component with a predetermined wavelength (13.5 nm, for example) of this light is reflected and collected by a collector mirror 10. The EUV light 3 is output to an exposure unit, for example, via the EUV filter 140 disposed at a focusing point of the collector mirror 10 and via an output optical system in the following stage. Here, the EUV filter 140 is a filter for selectively transmitting a light component with a predetermined wavelength (13.5 nm, for example) and for preventing a light component with unnecessary wavelengths from entering into a side of the exposure unit.

The target collecting unit 150 collects target material which was ejected from the target nozzle 110 and has not been irradiated with a laser beam 2 and has not contributed to the generation of EUV light 3.

The collector mirror exchanging apparatus 160 includes a collector mirror supporting base 161 which mounts the collector mirror unit 130, a mirror exchanging rail 162 disposed on the collector mirror supporting base 161, a position adjusting stage 163, an alignment pin 164, and an alignment fixing unit (not shown in the drawing).

The mirror exchanging rail 162 is used as a guide for regulating a moving direction of the collector mirror unit 130, when the collector mirror unit 130 is taken out of the chamber in a mirror exchanging operation. The alignment pin 164 is disposed at a front end of the mirror exchanging rail 162, and the collector mirror unit 130 is moved until striking this position to obtain a positional accuracy.

The position adjusting stage 163 includes an XYZ stage which can move in the three-dimensional directions, a stage which can rotate in the horizontal plane and a stage which can rotate in a direction of elevation angles, and adjusts a position and posture of the collector mirror unit 130.

The alignment fixing device is provided on the collector mirror supporting base 161 for fixing a position of the collector mirror unit 130 after the position thereof have been adjusted. That is, when the alignment fixing unit is locked, a position of the collector mirror unit is fixed, and when the lock is released, a position of the collector mirror unit is allowed to be moved.

In the present embodiment, the collector mirror 10 is exchanged as follows. First, lock of the alignment fixing device is released and the collector mirror unit 130 is moved along the mirror exchanging rail 162 to the backward direction of the collector mirror 10 (in the left direction in the drawing) to be taken out from the chamber. Then, outside the chamber, a collector mirror 10 in the collector mirror unit 130 is exchanged for a new one, and the collector mirror unit 130 after the mirror exchange is mounted on the collector mirror supporting base 161 and moved along the mirror exchanging rail 162 in the forward direction of the collector mirror 10 (in the right direction in the drawing) to be returned to a former position. Thereby, mirror exchanging can be carried out safely and easily even for a heavy collector mirror unit 130.

Figure 3:
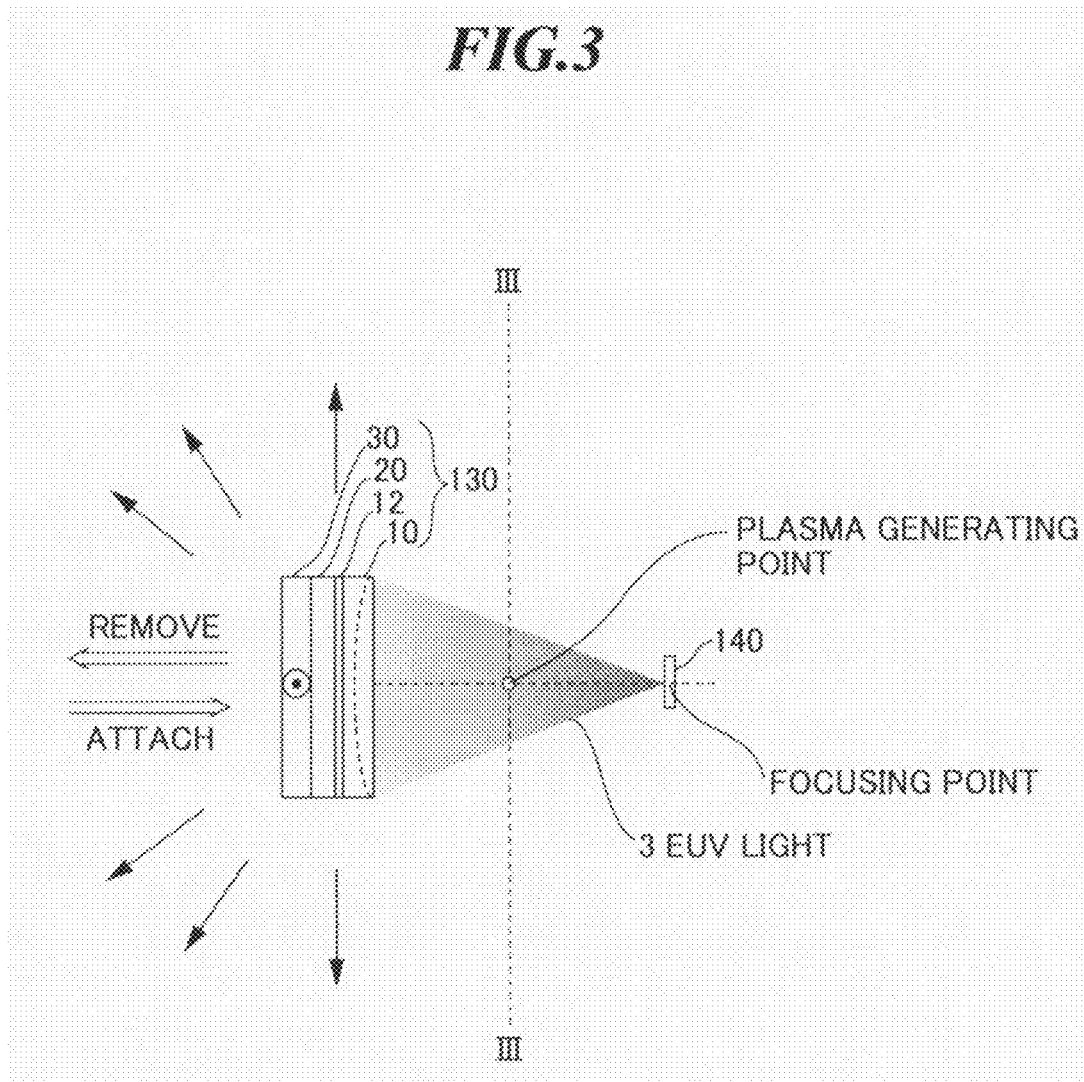
FIG. 3 is a plan view showing the collector mirror unit shown in FIG. 1.

FIG. 3 is a plan view showing a positional relationship among the collector mirror unit 130, the plasma generating point, and the focusing point. The collector mirror unit 130 is preferably moved in a backward side (left side area in the drawing) of a plane shown by a broken line III-III (a plane which is perpendicular to an axis including the plasma generating point and the focusing point, and includes the plasma generating point). This is because units such as the target nozzle 110, the EUV filter 140, the target collecting unit 150 etc. (refer to FIG. 1) are disposed in the forward side of the collector mirror 10, and the collector mirror unit 130 need to be prevented from interfering with these units in the mirror exchanging operation. Specifically, as shown by arrows in FIG. 3, the collector mirror unit 130 is moved backward (left direction in the drawing), sideways (upward or downward direction in the drawing), or upward or downward (direction out of or into the drawing) such that a moving path of the collector mirror unit 130 does not cross the above-mentioned plane including the plasma generating point.

Although the collector mirror unit 130 is moved backward in the present embodiment, in the case where the collector mirror unit 130 is moved in another direction, the collector mirror unit 130 may be moved along the mirror exchanging rail 162 after the position adjusting stage 163 has been rotated by a desired angle (90 degrees or less), for example.

Further, as guiding means for guiding the collector mirror unit 130, the mirror exchanging rail 162 is provided to the side of the collector mirror exchanging apparatus 160 in the present embodiment, however, the mirror exchanging rail 162 may be provided to the side of the collector mirror unit 130 or a groove may be formed on the side of the collector mirror unit 130 so that a moving direction of the collector mirror unit 130 is regulated.

Figure 4:
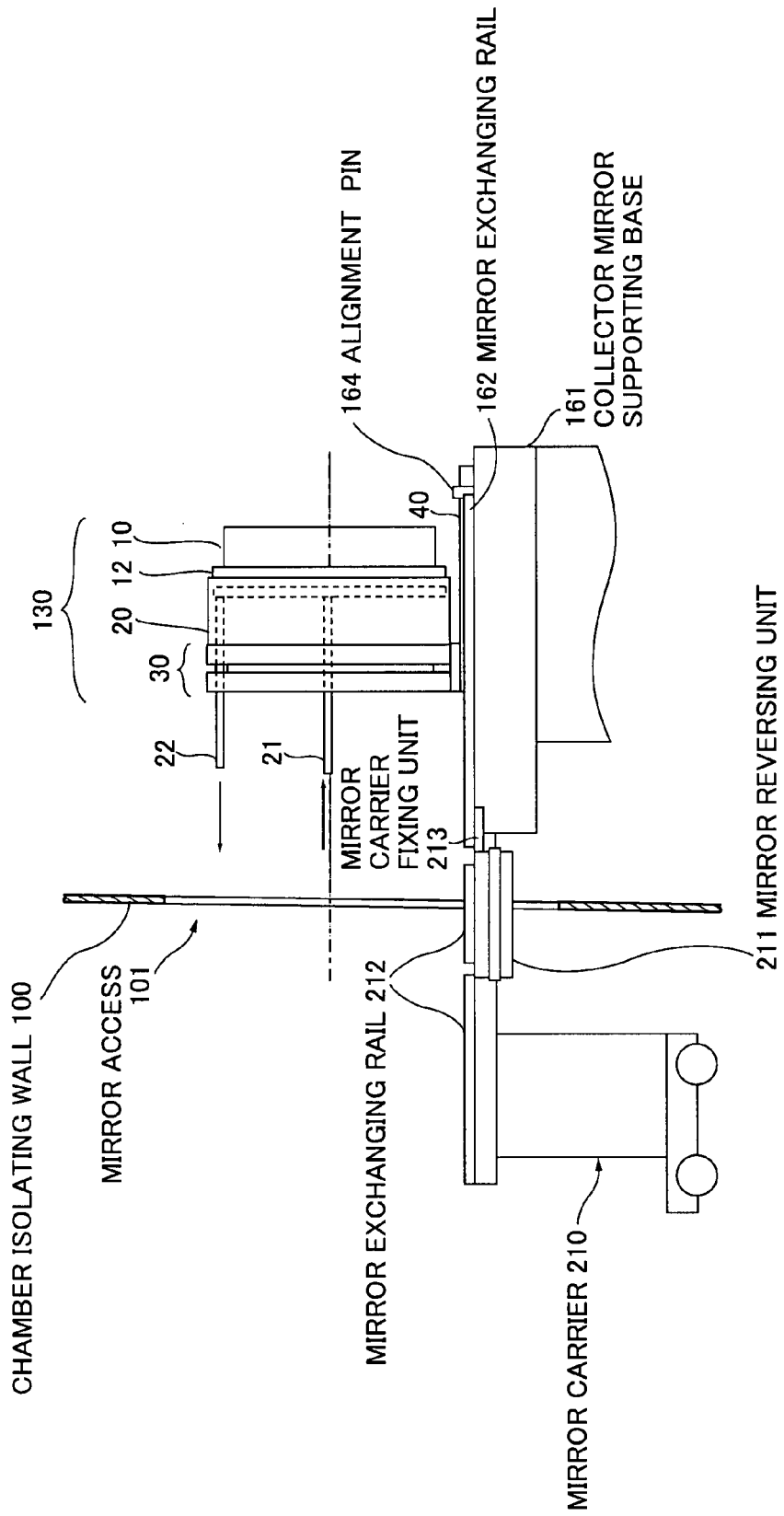
FIG. 4 is a side view showing a collector mirror exchanging apparatus according to a second embodiment of the present invention.

Next, a collector mirror exchanging apparatus according to a second embodiment of the present invention will be described with reference to FIG. 4. FIG. 4 is a side view showing the collector mirror exchanging apparatus according to the present embodiment and a collector mirror unit mounted thereon. Also, FIG. 4 shows a chamber isolating wall 100 of an EUV light source apparatus in which the collector mirror exchanging apparatus is used.

The collector mirror exchanging apparatus shown in FIG. 4 further includes a mirror carrier 210, a mirror reversing unit 211, a mirror exchanging rail 212, and a mirror carrier fixing unit 213, in addition to the collector mirror exchanging apparatus 160 shown in FIG. 1.

The mirror carrier 210 is a carriage used for carrying the collector mirror unit 130. Also, the mirror reversing unit 211 has a rotating stage which rotates in the horizontal plane and reverses a direction of the corrector mirror unit 130 by rotating the rotating stage mounting the collector mirror unit 130 thereon. On the mirror carrier 210 and the mirror reversing unit 211, the mirror exchanging rail 212 is disposed as a guide to be used when the collector mirror unit 130 is moved. Also, the mirror carrier fixing unit 213 fixes the mirror carrier 210 to a collector mirror supporting base 161 via the mirror reversing unit 211.

These units 210 to 213 are used by being inserted into a chamber through a mirror access 101 provided on the chamber isolating wall 100 in the rear side of the collector mirror unit 130, when the collector mirror unit 130 is exchanged. At this time, a part of the mirror reversing unit 211 is inserted into the chamber and a carriage part of the mirror carrier 210 is made to wait outside the chamber (in the left side of the chamber isolating wall 100). Alternatively, when the collector mirror unit 130 is disposed at a back of a vacuum chamber, the carriage part of the mirror carrier 210 may be moved close to the chamber isolating wall 100 to insert the mirror reversing unit 211 further into the back such that a protruded part of the mirror exchanging rail 212 on the mirror carrier 210 enters into the chamber, for example. Although the mirror access 101 is shown in an open state in FIG. 4, the mirror access 101 is usually closed by a mirror exchanging hatch during generation of EUV light.

A collector mirror exchanging method according to the present embodiment will be described with reference to FIGS. 4 and 5.

First, a pressure and an atmosphere within the chamber is set to be a nitrogen atmosphere with a pressure the same as or a slightly higher (positive pressure) than an outside air pressure. Next, the mirror exchanging hatch provided on the chamber isolating wall 100 is opened. Then, the mirror reversing unit 211 is inserted through the openedmirror access 101, and fixed to the collector mirror supporting base 161 by using the mirror fixing unit 213. Thereby, the mirror exchanging rail 162 on the collector mirror supporting base 161 and the mirror exchanging rail 212 on the mirror reversing unit 211 and the mirror carrier 210 are coupled substantially in a straight line and a direction in which the collector mirror unit 130 is to be moved is determined.

Next, a lock of an alignment fixing unit on the collector mirror supporting base 161 is released to enable the collector mirror unit 130 to be moved. Then, the collector mirror unit 130 is moved along the mirror exchanging rails 162 and 212 onto the mirror reversing unit 211.

Figure 5:
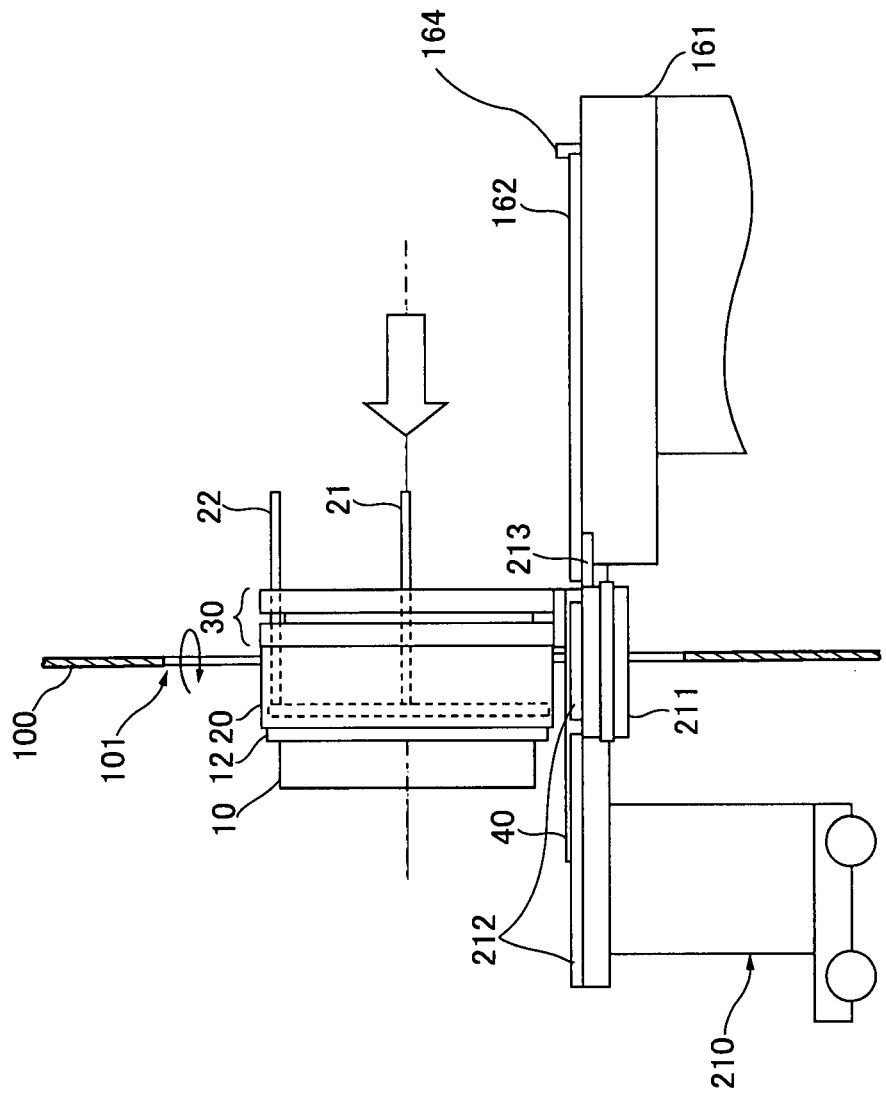
FIG. 5 is a side view showing an appearance in which a collector mirror unit is reversed in the collector mirror exchanging apparatus according to the second embodiment of the present invention.

Next, as shown in FIG. 5, the stage of the mirror reversing unit 211 is rotated by 180 degrees to reverse the direction of the collector mirror unit 130. In a state in which a collector mirror 10 faces outside of the chamber in this manner, the used collector mirror 10 is removed from the collector mirror unit 130 and a new collector mirror 10 is attached.

Next, the stage of the mirror reversing unit 211 is rotated by 180 degrees to make the collector mirror 10 face inside the chamber. Then, the collector mirror unit 130 is moved along the mirror exchanging rails 212 and 162 to a position where the collector mirror unit 130 strikes an alignment pin 164. Further, the alignment fixing unit on the collector mirror fixing base 161 is locked. Lastly, the mirror exchanging hatch is closed and a collector mirror exchanging operation is completed. At this stage, the collector mirror unit 130 is in a rough alignment at this stage, and an accurate alignment is further to be carried out before EUV light generation is started again.

Here, as described hereinabove, pipes 21 and 22 provided to a cooling unit 20 of the collector mirror unit 130 are made of a flexible material and the movement and rotation of the collector mirror unit 130 can be carried out smoothly. However, in order to carry out more smooth rotation or the like of the collector mirror unit 130, the rotation or the like of the collector mirror unit 130 may be carried out after the pipes 21 and 22 are removed.

Also, while only a collector mirror 10 is exchanged in the present embodiment, the whole collector mirror unit 130 may be exchanged for a new one. At this time, another collector mirror unit 130 attached with a new collector mirror 10 and mounted on another mirror carrier 210 may be prepared for carrying out a collector mirror exchanging operation quickly. In this case, an exchanging operation is carried out as follows. A used collector mirror unit 130 is mounted on a mirror carrier 210, and then, the mirror carrier 210 is moved after the mirror carrier fixing unit 213 has been released, and in exchange, another mirror carrier 210 having a new collector mirror unit 130 thereon is fixed to the collector mirror supporting base 161 to move the collector mirror unit 130 into the chamber. In this case, the pipes 21 and 22 may be shifted from the used collector mirror unit 130 to the new collector mirror unit 130 at any timing, however, the shift may be carried out more smoothly outside the chamber.

Figure 6:
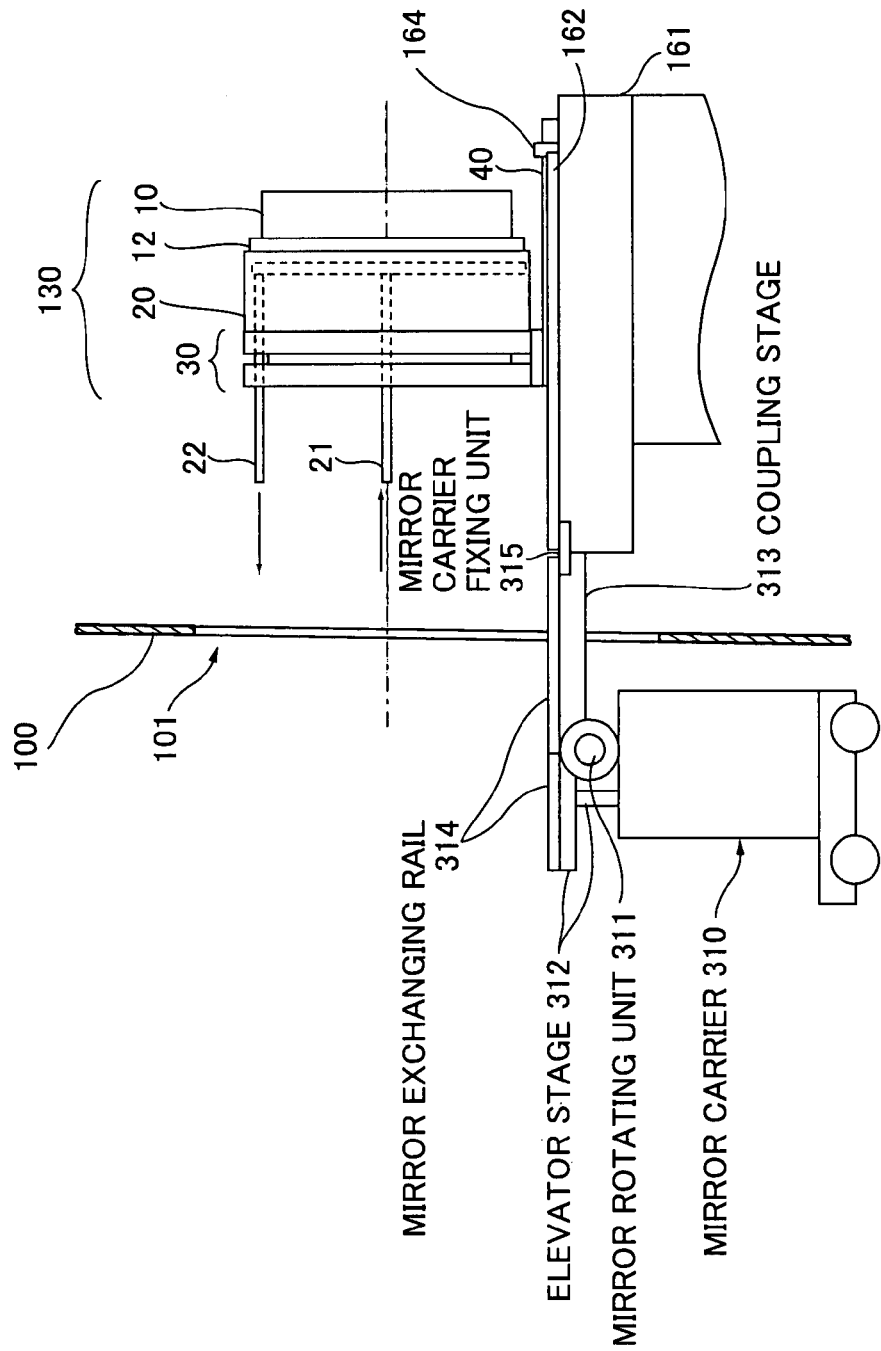
FIG. 6 is a side view showing a collector mirror exchanging apparatus according to a third embodiment of the present invention.

Next, a collector mirror exchanging apparatus according to a third embodiment of the present invention will be described with reference to FIG. 6. FIG. 6 is a side view showing the collector mirror exchanging apparatus according to the present embodiment and a collector mirror unit mounted thereon. Also, FIG. 6 shows a chamber isolating wall 100 of an EUV light source apparatus in which the collector mirror exchanging apparatus is used.

The collector mirror exchanging apparatus shown in FIG. 6 further includes a mirror carrier 310, a mirror rotating unit 311 having a rotating axis perpendicular to the drawing, an elevator stage 312, a coupling stage 313, a mirror exchanging rail 314, and a mirror carrier fixing unit 315, in addition to the collector mirror exchanging apparatus 160 shown in FIG. 1.

The mirror carrier 310 is a carriage to be used for carrying a collector mirror unit 130. Also, the mirror rotating unit 311 and the elevator stage 312 are units for rotating the collector mirror unit 130 mounted on the coupling stage 313 within the vertical plane to change the direction of the collector mirror unit 130. Further, the coupling stage 313 is a stage for coupling the elevator stage 312 and the collector mirror supporting base 161, and a part thereof is inserted into a chamber through a mirror access 101 provided on the chamber isolating wall 100 when a collector mirror is exchanged. On these elevator stage 312 and coupling stage 313, the mirror exchanging rail 314 to be used as a guide for moving the collector mirror unit 130 is disposed. Also, the mirror carrier fixing unit 315 fixes the mirror carrier 310 to the collector mirror supporting base 161 via the coupling stage 313.

A collector mirror exchanging method according to the present embodiment will be described with reference to FIGS. 6 and 7.

In the present embodiment, the collector mirror unit 130 is rotated within the vertical plane by about 90 degrees by using the mirror rotating unit 311 and the elevator stage 312, instead of being rotated within the horizontal plane to change a direction thereof (second embodiment).

Figure 7:
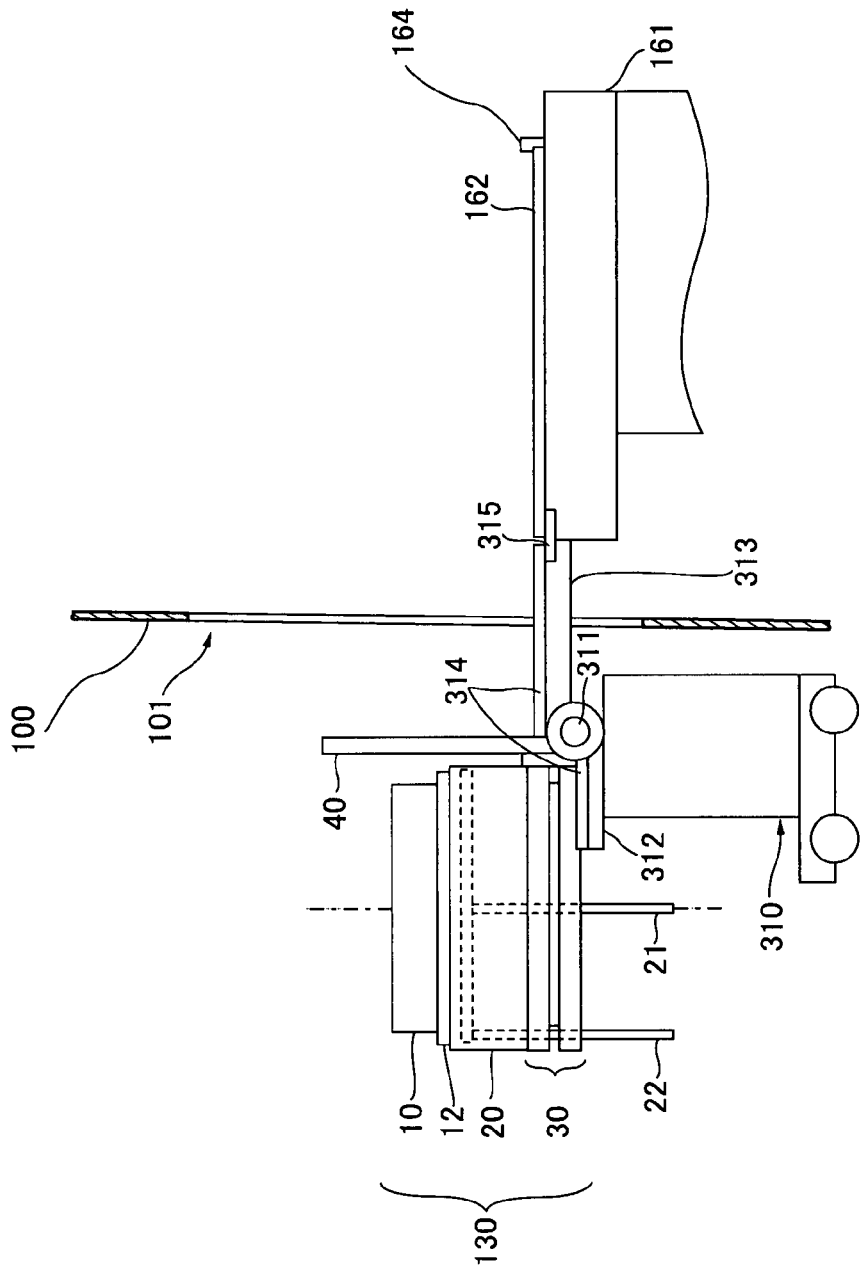
FIG. 7 is a side view showing an appearance in which a collector mirror is rotated in the collector mirror exchanging apparatus according to the third embodiment of the present invention.

Thereby, a reflecting surface of the collector mirror 10 faces upward as shown in FIG. 7, and the collector mirror 10 is exchanged in this state. Since the collector mirror 10 has a heavy weight, when the collector mirror 10 is made to face upward, a mirror exchanging operation and the following positioning operation to position the collector mirror 10 against a collector mirror fixing unit 12 (FIG. 2) can be carried out easily. Other exchanging sequences are similar to those in the second embodiment.

Next, a collector mirror exchanging apparatus according to a fourth embodiment of the present invention will be described with reference to FIGS. 8A to 9. FIG. 8A is a rear view showing an EUV light source apparatus in which the collector mirror exchanging apparatus according to the present embodiment is provided, and FIG. 8B is a side view showing a part of the EUV light source apparatus. Also, FIG. 9 is an enlarged plan view showing the EUV light source apparatus shown in FIGS. 8A and 8B.

The EUV light source apparatus shown in FIGS. 8A to 9 is provided with a laser unit 400 to be used for a collector mirror alignment outside a chamber (left side of a chamber isolating wall 100). An opening is formed in the center of a collector mirror unit 130 for transmitting a laser beam 404 for alignment. Further, a mirror exchanging hatch 102 is provided on the chamber isolating wall 100 in the rear side of the collector mirror unit 130, and an alignment window 103 is provided at the center thereof. A part of this window 103 is made of a material to transmit the laser beam 404 for alignment therethrough. Although a sliding type mirror exchanging hatch 102 is shown in FIGS. 8A and 8B, another type of hatch may be used for opening and closing the hatch, if a space allows therefor.

As shown in FIG. 9, the alignment laser unit 400 includes a helium (He)-neon (Ne) laser 401 and reflecting mirrors 402 and 403. Positions and directions of these reflectingmirrors 402 and 403 are set such that a laser beam 404 output from the He—Ne laser 401 transmits the alignment window 103 and passes through the center opening of the collector mirror unit 130.

The collector mirror exchanging apparatus according to the present embodiment has a structure to accommodate the case where such an alignment laser unit 400 is provided. That is, as shown in FIG. 9, this collector mirror exchanging apparatus includes a mirror exchanging guide stage 410, a mirror carrier 420, and a collector mirror supporting base 161 which is disposed inside the chamber isolating wall. The collector mirror supporting base 161 is provided with a mirror exchanging rail 162 and an alignment pin 164.

The mirror exchanging guide stage 410 is a movable stage to be used when the collector mirror unit 130 is taken out of the chamber, and on the upper surface thereof, there are provided a drawing guide 411 to be used when the collector mirror unit 130 is drawn backward out of the chamber, and a sliding guide 412 for preventing the collector mirror unit 130 from falling and to be used when the collector mirror unit 130 is slid to a lateral side.

Meanwhile, the mirror carrier 420 is a carriage for carrying the collector mirror unit 130. The mirror carrier 420 is provided with a coupling guide 421 for coupling to the mirror exchanging guide stage 410, a sliding guide 422 to be used when the collector mirror unit 130 is slid, and a guide 423 for preventing the collector mirror unit 130 from falling.

Next, a collector mirror exchanging method according to the present embodiment will be described with reference to FIGS. 9 to 14.

First, as shown in FIG. 9, a pressure and an atmosphere within the chamber is set to be a nitrogen gas with a pressure the same as or a slightly higher (positive pressure) than that of outside air. Also, a mirror carrier 420 is prepared near the chamber.

Figure 10:
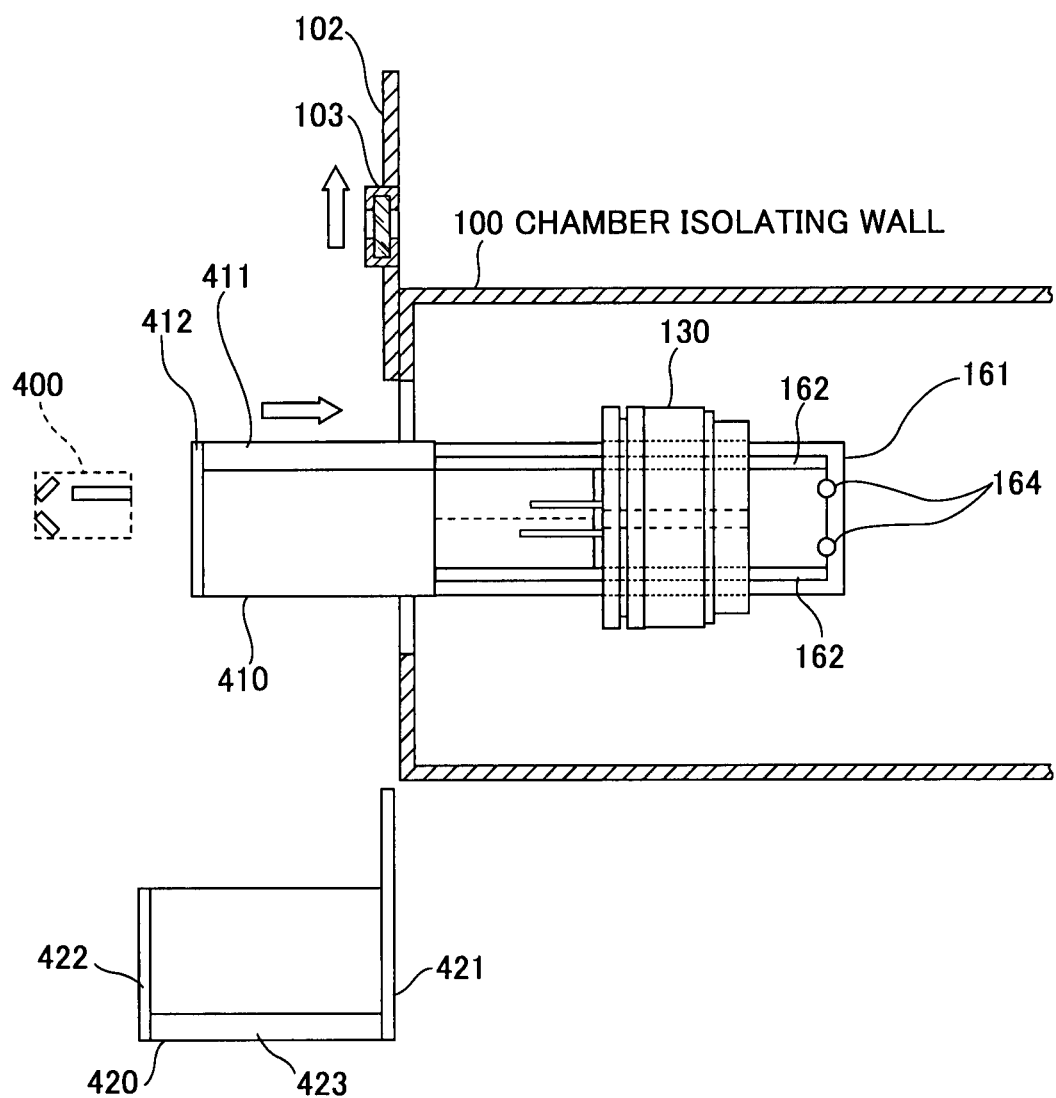
FIG. 10 is a plan view illustrating a collector mirror exchanging method according to the fourth embodiment of the present invention.

Next, as shown in FIG. 10, the mirror exchanging hatch 102 is opened, and the mirror exchanging guide stage 410 is slid and inserted into the chamber to be fixed to the collector mirror supporting base 161. Thereby, the mirror exchanging rail 162 on the collector mirror supporting base 161 and the drawing guide 411 on the mirror exchanging guide stage 410 are coupled substantially in a straight line and a direction in which the collector mirror unit 130 is moved is determined.

Figure 11:
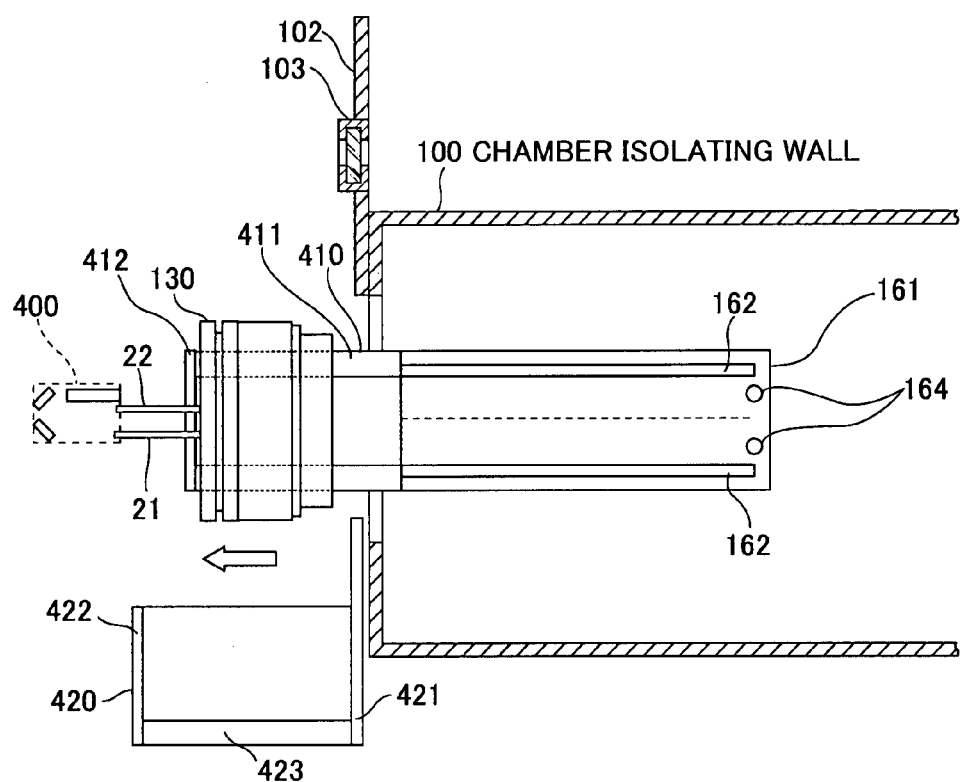
FIG. 11 is a plan view illustrating the collector mirror exchanging method according to the fourth embodiment of the present invention.

Next, a lock of an alignment fixing unit on the collector mirror supporting base 161 is released to enable the collector mirror unit 130 to be moved. Then, as shown in FIG. 11, the collector mirror unit 130 is moved along the mirror exchanging rail 162 and the drawing guide 411 to a position near a rear end of the mirror exchanging guide stage 410. Then, pipes 21 and 22 connected to the collector mirror unit 130 are removed.

Figure 12:
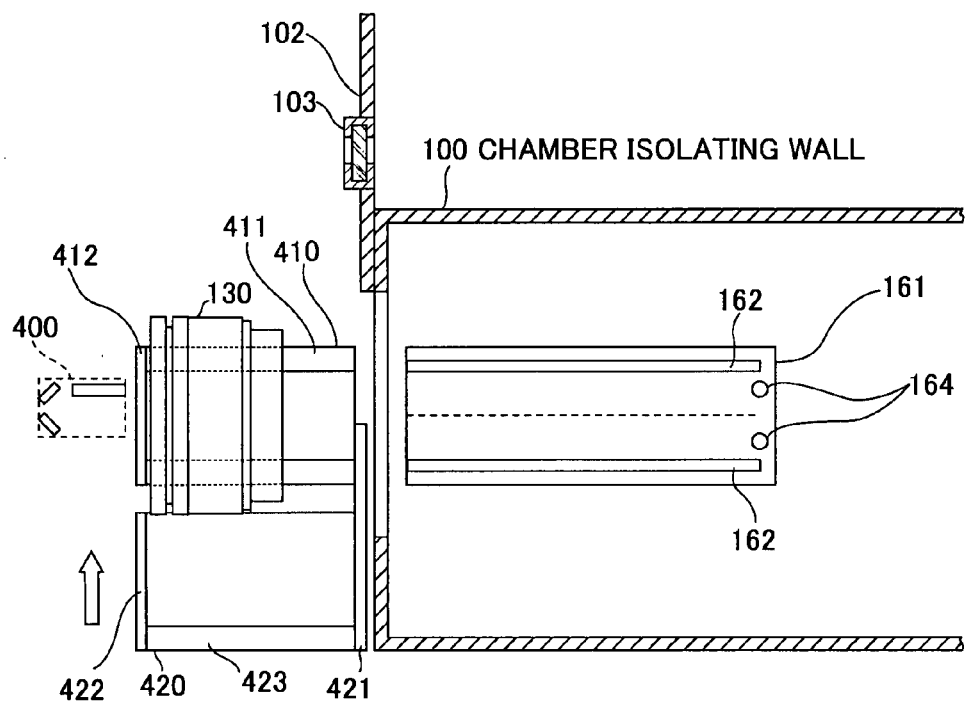
FIG. 12 is a plan view illustrating the collector mirror exchanging method according to the fourth embodiment of the present invention.
Figure 13:
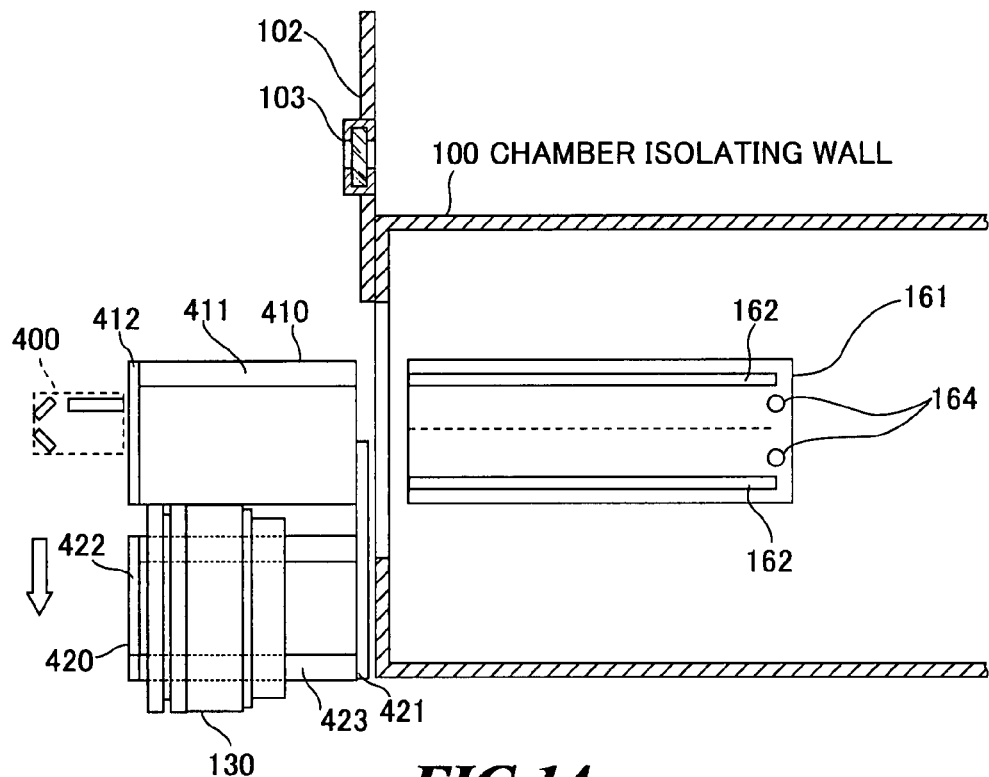
FIG. 13 is a plan view illustrating the collector mirror exchanging method according to the fourth embodiment of the present invention.
Figure 14:
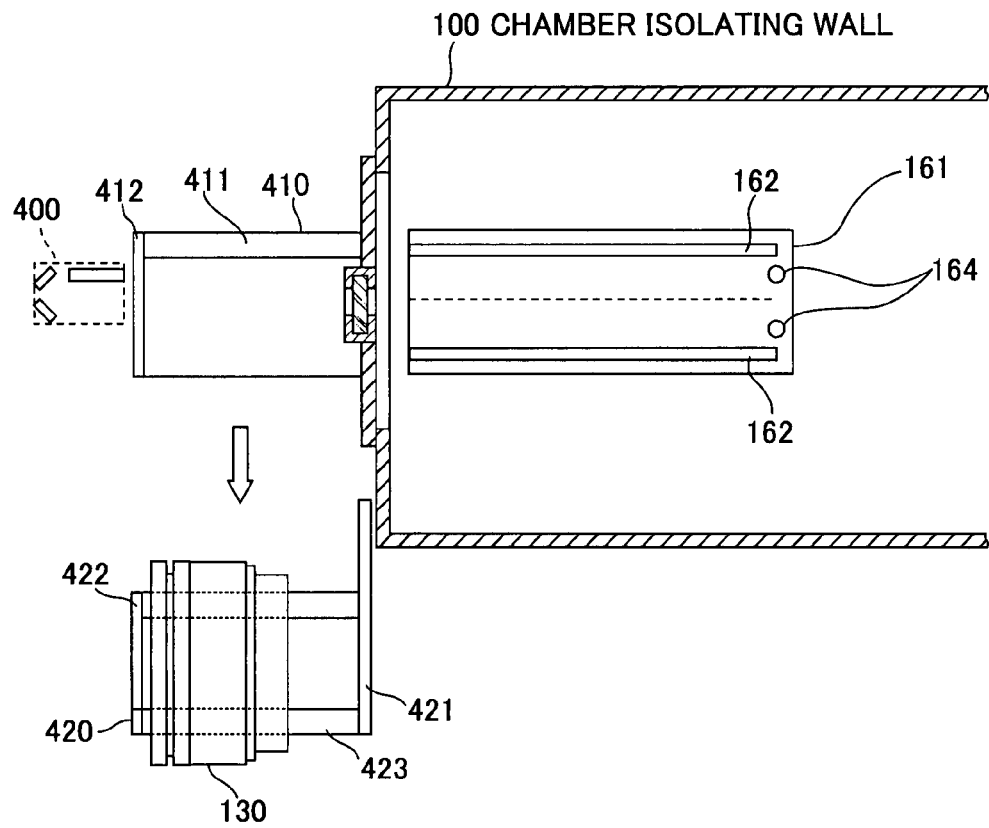
FIG. 14 is a plan view illustrating the collector mirror exchanging method according to the fourth embodiment of the present invention.

Next, as shown in FIG. 12, the mirror exchanging guide stage 410 is drawn out from the chamber together with the whole collector mirror unit 130. Then, the coupling guide 421 of the mirror carrier 420 bridge-connects the mirror exchanging guide stage 410 to couple the mirror carrier 420 to the mirror exchanging guide stage 410. Next, as shown in FIG. 13, the collector mirror unit 130 is moved along the sliding guides 412 and 422 to the mirror carrier 420, and then, as shown in FIG. 14, the collector mirror unit 130 mounted on the mirror carrier 420 is carried.

Next, a used collector mirror 10 is exchanged for a new collector mirror 10 at a destination of the collector mirror unit 130. Alternatively, the whole collector mirror unit 130 may be exchanged for a new one. Then, the collector mirror unit 130 is moved in the reverse sequence of taking out the collector mirror unit 130, and disposed within the chamber after the pipes 21 and 22 having been connected. Thereby, a collector mirror exchanging operation is completed. At this stage, the collector mirror 10 is in a rough alignment and an accurate alignment is further to be carried out.

While, in the present embodiment, a moving direction of the collector mirror is changed (backward to sideways) in this manner, a moving path of the collector mirror unit does not cross a plane including a plasma generating point (plane shown by a broken line III-III in FIG. 3) in either direction. Therefore, the collector mirror unit can be exchanged smoothly without interfering with the units disposed within the chamber.

Also, in the present embodiment, another mirror carrier on which a new collector mirror unit 130 is mounted may be preliminarily prepared. Thereby, it becomes possible to carry out a collector mirror exchanging operation further efficiently.

Figure 15:
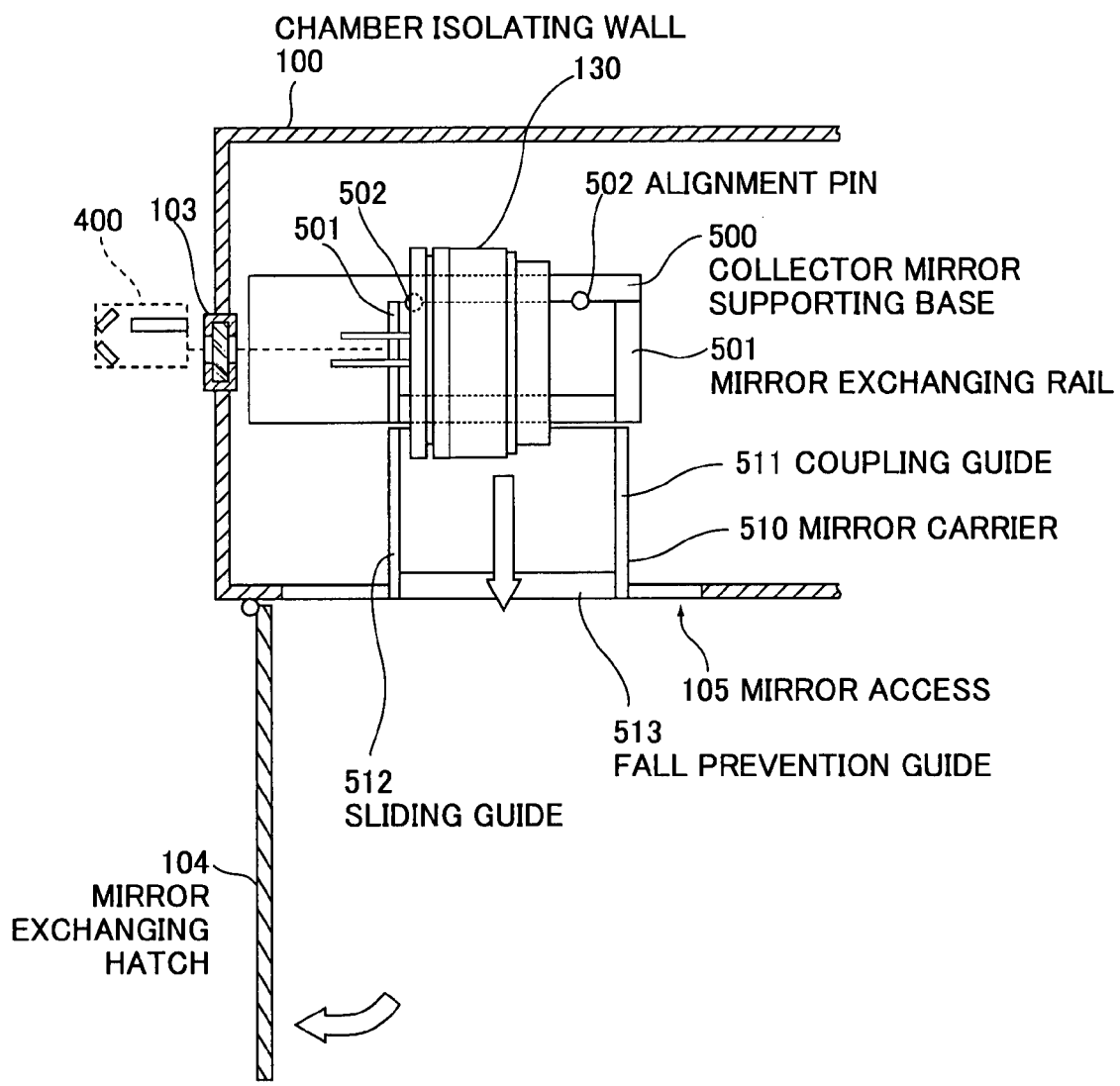
FIG. 15 is a plan view showing a part of an extreme ultra violet light source apparatus including a collector mirror exchanging apparatus according to a fifth embodiment of the present invention.

Next, a collector mirror exchanging apparatus and exchanging method according to a fifth embodiment of the present invention will be described with reference to FIG. 15. FIG. 15 is a plan view showing a part of an EUV light source apparatus in which the collector mirror exchanging apparatus according to the present embodiment is provided.

As shown in FIG. 15, in the case where a space for maintenance is obtained in a lateral side (downward in the drawing) of a collector mirror unit 130, the collector mirror unit 130 may be drawn out to the lateral side for exchanging a collector mirror.

In this case, on a collector mirror supporting base 500 which supports the collector mirror unit 130 within a chamber, there are disposed a mirror exchanging rail 501 to be used as a guide when the collector mirror unit 130 is moved sideways and an alignment pin 502 which determines a stop position of the collector mirror unit 130 in a sideways direction thereof. Also, a mirror carrier 510, which is provided with a coupling guide 511, a sliding guide 512, and a fall prevention guide 513, is used as a carriage for carrying the collector mirror unit 130.

When a collector mirror is exchanged, a mirror exchanging hatch 104 provided on a lateral side of the collector mirror unit 130 is opened and the mirror carrier 510 is inserted into the chamber through a mirror access 105. Then, the collector mirror unit 130 is moved along the mirror exchanging rail 501 and the sliding guide 512 onto the mirror carrier 510, and the collector mirror unit 130 mounted on the mirror carrier 510 is drawn out of the chamber. Further, a collector mirror 10 is exchanged for a new one, and the collector mirror unit is attached again within the chamber in the reverse sequence. Alternatively, the whole collector mirror unit 130 may be exchanged for a new one.

According to the present embodiment, even in the case where an alignment laser unit 400 is disposed on the rear side of the collector mirror unit 130, a collector mirror exchanging operation can be carried out without consideration of an interference with the unit 400.

Although, in the present invention, the collector mirror 10 is exchanged in a state in which the collector mirror unit 130 is just slid out, the collector mirror 10 may be exchanged after the direction of the collector mirror unit 130 has been changed, if required. In this case, a mechanism for rotating the collector mirror unit 130 may be provided to the mirror carrier 510, as described in the second and third embodiments.

Figure 16:
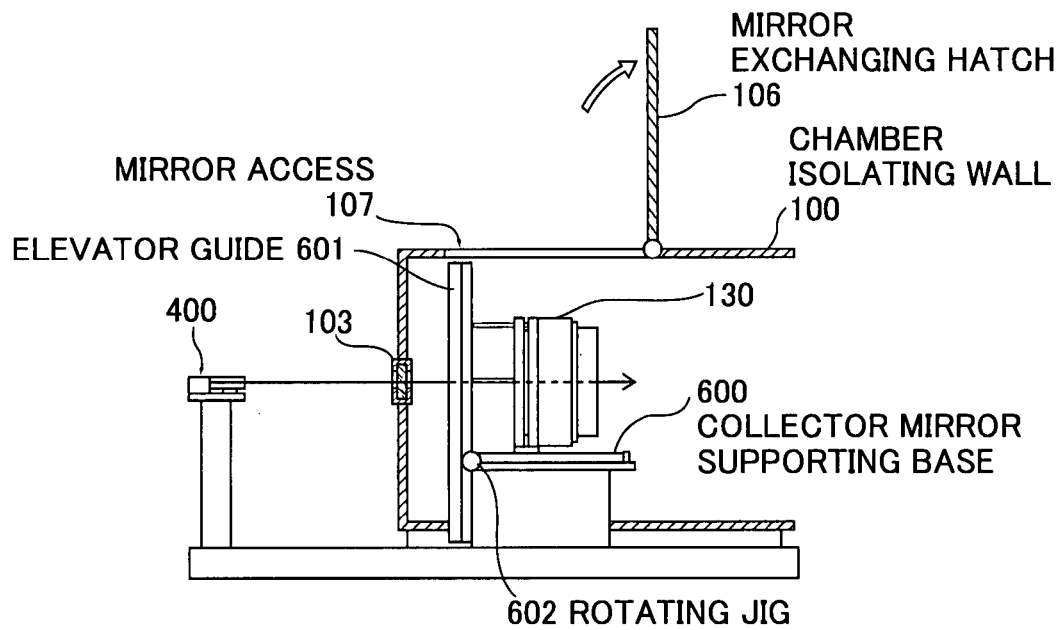
FIG. 16 is a side view showing a part of an extreme ultra violet light source apparatus including a collector mirror exchanging apparatus according to a sixth embodiment of the present invention.
Figure 17:
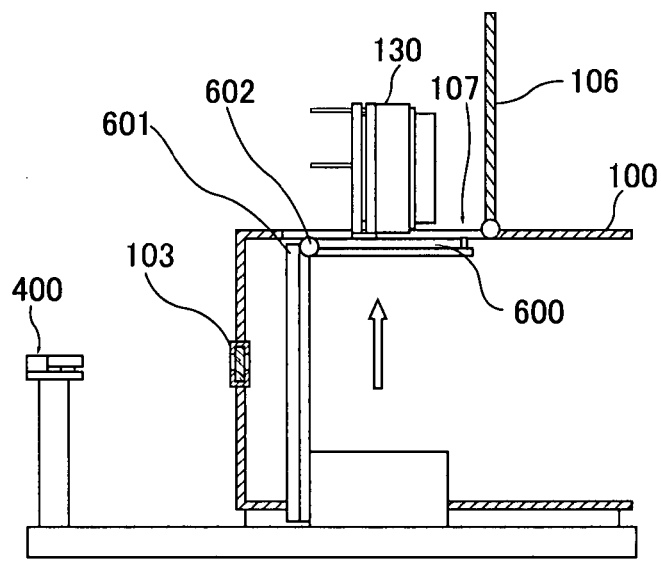
FIG. 17 is a side view illustrating a collector mirror exchanging method according to the sixth embodiment of the present invention.
Figure 18:
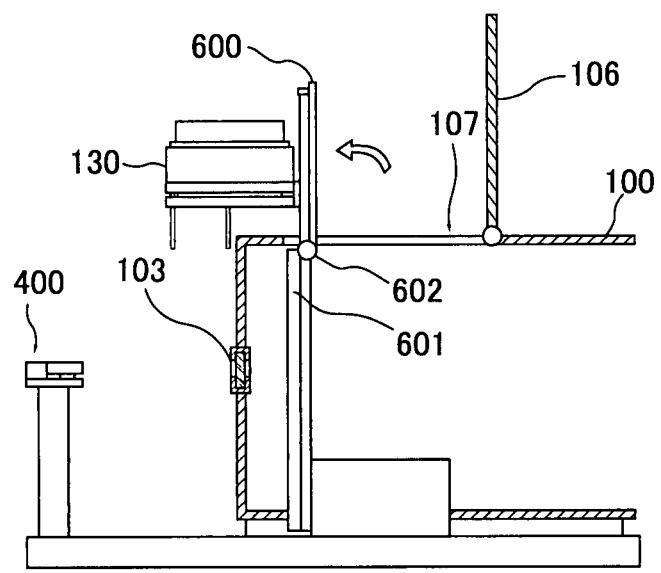
FIG. 18 is a side view illustrating the collector mirror exchanging method according to the sixth embodiment of the present invention.

Next, a collector mirror exchanging apparatus and exchanging method according to a sixth embodiment of the present invention will be described with reference to FIGS. 16 to 18. FIGS. 16 to 18 are side views showing a part of an EUV light source apparatus in which the collector mirror exchanging apparatus according to the present embodiment is provided.

As shown in FIG. 16, in the case where a space for maintenance can be obtained in the upper side of a collector mirror unit 130 (upward in the drawing), a collector mirror may be exchanged by drawing out the collector mirror unit 130 upward.

In this case, a collector mirror supporting base 600 for supporting the collector mirror unit 130 and an elevator guide 601 are provided within a chamber. The collector mirror supporting base 600 is disposed so as to go up or down along the elevator guide 601. Also, the collector mirror supporting base 600 is attached to the elevator guide 601 via a rotating jig 602. The rotating jig 602 has a rotating axis perpendicular to the drawing.

When a collector mirror is exchanged, as shown in FIG. 16, a mirror exchanging hatch 106, which is provided above the collector mirror unit 130, is opened. Then, as shown in FIG. 17, the collector mirror supporting base 600 is lifted along the elevator guide 601, and the collector mirror unit 130 is taken out through a mirror access 107. Further, as shown in FIG. 18, the collector mirror supporting base 600 is rotated by about 90 degrees and the reflecting surface of a collector mirror 10 is made to face upward. In this state, the collector mirror 10 is exchanged for a new one. After that, the collector mirror unit 130 is attached again within the chamber in the reverse sequence.

According to the present embodiment, even in the case where an alignment laser unit 400 is disposed on the rear side of the collector mirror unit 130, a collector mirror exchanging operation can be carried out without a consideration of an interference with the unit 400.

Although the collector mirror 10 is exchanged in a state reflecting surface thereof is made to face upward in the present embodiment, the mirror may be exchanged in a state the surface thereof continues to face sideways. In this case, the rotating jig 602 may not be provided.

Although, in the first to sixth embodiments described hereinabove, a structure (collector mirror unit) including a collector mirror with a cooling unit and a rotating unit is used, the present invention may be applied to the case where a structure not including a peripheral mechanism of a collector mirror is exchanged, that is, the case where only a collector mirror or a structure including a collector mirror and only a supporting mechanism thereof is exchanged.

The invention claimed is:

1. An extreme ultra violet light source apparatus for generating extreme ultra violet light by irradiating a target material in a chamber with a laser beam from outside of said chamber to generate plasma and collecting a predetermined wavelength component emitted from the plasma, said apparatus comprising:

a collector mirror configured to reflect and collect a predetermined wavelength component emitted from plasma generated within the chamber;

a cooling unit provided at a rear side of said collector mirror and including pipes formed of a flexible material, and configured to circulate a coolant;

a position adjusting stage configured to adjust a position and/or a posture of at least said collector mirror, said position adjusting stage includes at least one of an XYZ stage movable in three-dimensional directions, a stage rotatable in a horizontal plane, and a stage rotatable in a direction of elevation angles;

a guide rail configured to regulate a moving direction of at least said collector mirror on a supporting base within said chamber, said guide rail being arranged not to cross a plane, the plane being perpendicular to an axis and passing through a plasma generation point within the chamber, the axis including the plasma generating point and a focusing point of extreme ultra violet light reflected by said collector mirror, and the guide rail is arranged such that the moving direction of the collector mirror on the supporting base is parallel to the axis which includes the plasma generating point and the focusing point; and an alignment member fixed on the supporting base and aligning a position of at least said collector mirror on the supporting base.

2. An extreme ultra violet light source apparatus for generating extreme ultra violet light by irradiating a target material in a chamber with a laser beam from outside of said chamber to generate plasma and collecting a predetermined wavelength component emitted from the plasma, said apparatus comprising:

a collector mirror structure including a collector mirror configured to reflect and collet the predetermined wavelength component emitted from the plasma generated within said chamber, a cooling unit provided at a rear side of said collector mirror and including pipes formed of a flexible material, and configured to circulate a coolant, a position adjusting stage configured to adjust a position and/or a posture of at least said collector mirror, and a guide rail configured to regulate a moving direction of at least said collector mirror on a supporting base within said chamber, said guide rail being arranged no to cross a plane, the plane being perpendicular to an axis and passing through a plasma generation point within the chamber, the axis including the plasma generating point and a focusing point of extreme ultra violet light reflected by said collector mirror, and the guide rail is arranged such that the moving direction of the collector mirror on the supporting base is parallel to the axis which includes the plasma generating point and the focusing point;

a target collecting unit for collecting the target material which has not contributed to generation of the extreme ultra violet light; and an alignment member fixed on the supporting base and aligning a position of at least said collector mirror on the supporting base.

\* \* \* \* \*